United States Patent [19]

Hemming

[11] Patent Number: 4,977,296
[45] Date of Patent: Dec. 11, 1990

[54] RADIO FREQUENCY SHIELDING TAPE

[76] Inventor: Leland H. Hemming, 13329 Canyon Back La., Poway, Calif. 92064

[21] Appl. No.: 313,874

[22] Filed: Feb. 23, 1989

[51] Int. Cl.$^5$ .............................................. H05K 9/00
[52] U.S. Cl. ........................ 174/35 MS; 219/10.55 D
[58] Field of Search .......... 174/35 R, 35 MS, 35 GC; 361/424; 333/12, 248; 219/10.55 D, 10.55 R

[56] References Cited

U.S. PATENT DOCUMENTS 3,219,747 11/1965 McAdams ..................... 174/35 GC

Primary Examiner—Leo P. Picard
Assistant Examiner—Bot L. Ledynh
Attorney, Agent, or Firm—Ralph S. Branscomb

[57] ABSTRACT

A structure for attenuating the passage of electromagnetic energy includes at least two panels made of electromagnetic energy-attenuating material having adjacent edges thereof either abutting or overlapping one another to form a portion of an enclosure. A shielding tape defining transverse waveguide channels either straddles the seam between the two panels in the abutting mode, or is sandwiched between the overlapping edges of the panels in the overlapping mode. In either mode, the shielding tape operates not to create complete conductive continuity between the two panels at every point, as do previous tapes and techniques, but rather to define a multiplicity of small waveguides which are operating beyond cutoff, and are of such an impedance relative to the impedance of the incoming electromagnetic energy that in the frequency range in question, the energy is attenuated by the channel waveguides to levels 50 dB to greater than 100 dB.

37 Claims, 4 Drawing Sheets

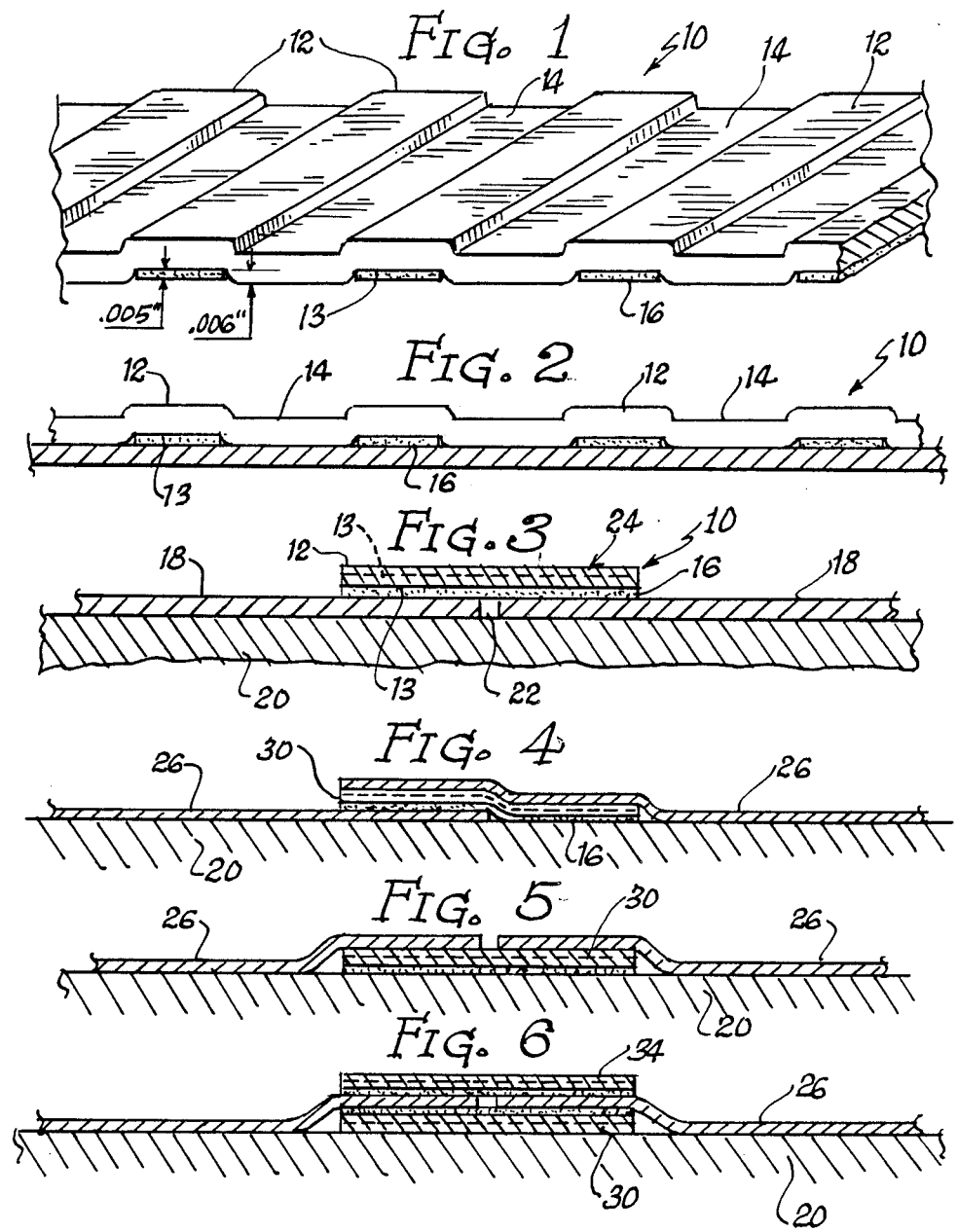

Calculated Performance of Shielding Tape

RADIO FREQUENCY SHIELDING TAPE

BACKGROUND OF THE INVENTION

The present invention relates generally to structures for shielding against the penetration of radiated electromagnetic energy, and particularly to joint structures and seams at which energy leakage occurs which is widely disproportionate to the net size of the pinholes or voids through which the radiation passes.

Classified information processing is generally performed on digital electronic equipment, such as computers and digitally controlled instrumentation. These devices transfer data between mainframe units and input and output devices such as keyboard terminals and printers. Because of such transfer of data and information, there is a risk of disclosure because of the availability of sophisticated electronic surveillance devices.

The effectiveness of surveillance devices has increased dramatically in recent years. To meet such sophistication, the shielding of electronic instrumentation has also increased dramatically in sophistication. From the shielding of each individual piece of equipment, the technology has moved to the shielding of entire rooms and even entire buildings.

This shielding is accomplished basically by covering the room or building in its entirety, walls, ceiling and floor, with thin metal sheets or foil. Transmission of radiation through the sheets or through the foil is not a problem. The problem arises at the joints between the sheets, or the seams between foil segments.

Currently, the most effective means of sealing panel joints is welding. Each panel is welded to each adjacent panel. A high quality weld must be performed, as pinholes will pass unacceptable amounts of radiation.

Welding is quite labor-intensive, and whereas it is the most effective joint-sealing means, achieving radiation attenuation of over 120 dB at frequencies of more than 10 GHz, it is, nonetheless, the most expensive technique and, at today's prices, causes the cost of the total enclosure to run between $25 and $35 per surface square foot.

Welding can only be done with plate being unsuitable for foil seams. The best seam sealing system for foil seams involves the use of a metal tape which has been plated with solder on one side. This tape is applied against the seams and the solder is fused to the foil with a hot flat iron. However, since thousands of feet of seam exists even in a moderately-sized installation, this method is also very labor-intensive, and the shielding performance is very sensitive to the quality of the workmanship.

The remaining method relies upon the use of conductive RF tapes, of which there are two basic varieties from a variety of manufacturers. The purpose of the tape is to create as high quality, point-to-point conduction between adjacent plates or foil as is possible, to electromagnetically simulate a continuous sheet of foil at the seams.

The first type of tape achieves the conductivity by the use of an adhesive that is loaded with metal particles. This tape is applied in wide widths across the seams in the foil walls. Unfortunately, the performance of the tape is limited to moderate levels of shielding-effectiveness, approximately 60 dB at the frequencies in question.

The second form of shielding tape comprises a flexible foil backing, the front side of which is covered with an adhesive. To penetrate the adhesive and make good conductive contact with the foil panels, the flexible metallic backing is embossed to produce a grid which penetrates the adhesive and makes reasonably good contact with the underlying foil or sheet metal panel when it is applied under substantial pressure by a roller. However, the metal to metal contact achieved by the embossed grid is still somewhat hit and miss. This creates the primary limitation of the tape's system, a lack of complete conductive continuity across the seam, which is especially critical in the microwave frequency spectrum.

SUMMARY OF THE INVENTION

The invention directly addresses the problem of attenuating electromagnetic radiation propagating between the abutting or overlapping edges of adjacent panels of shielding material—that is, radiation passing through the seams. Whereas the prior art has been addressed exclusively toward creating as continuous a solid conductive contact as possible between adjacent shielding sheets, the instant invention branches off into a substantially different direction. The tape of the instant invention does bond securely to both panels of adjacent shielding materials, making continuous metal-to-metal contact.

However, rather than relying on continuous continuity of the conductive contact, the tape defines a multiplicity of transverse channels which act as waveguides operating beyond cutoff. Electromagnetic energy is prevented from propagating through the narrow channels of the tape due to the large mismatch between the incident wave impedance and the impedance of the channel waveguides of the tape. Attenuation levels well over 100 dB can be routinely achieved when using the tape properly for frequencies up to 30 GHz.

The tape is formed by a corrugated foil backing which defines channels on one side, or in a double-sided version, on both sides. The channels are coated with an adhesive that is somewhat shallower than the channel, so that when the tape is compressed to press the adhesive against the underlying surface, it will hold the adjoining foil "lands" between the channels firmly against the underlying surface to create a good conductive contact.

The tape could also be provided as a metallic backing with the lands and the channels defined between the channels, but rather than having adhesive in the channels to bond the tape to the underlying shielding panels, the lands could be coated with solder and the tape ironed on as is conventional continuous-sheet solder tape.

By providing the tape as either single-sided or double-sided, the waveguides in question, defined by the channels in the tape, can be formed on one side of the tape as would be necessary, for example, for a butt-joint panel installation, or on both sides of the tape such as would be used for adjacent panels.

BRIEF DESCRIPTION OF THE DRAWINGS

FIG. 1 is an isometric view of the tape with adhesive on one side only;

FIG. 2 is a side elevation view of the tape;

FIG. 3 illustrates diagrammatically the simplest mode of application of the tape (butted foil or sheet metal, lying in the same plane, and covered at the seam with the tape);

FIG. 4 illustrates a second mode of use of the tape wherein double-sided tape is used in an overlap foil joint;

FIG. 5 illustrates yet another embodiment of a double-backed tape applied against a wall surface with a butted foil seam pressed onto the front of the tape;

FIG. 6 illustrates the most effective use of the tape wherein butted foil segments are sandwiched with a double-backed tape to the rear, and a single-backed tape is applied against the front of the seam;

DETAILED DESCRIPTION OF THE PREFERRED EMBODIMENTS

Figure 7:
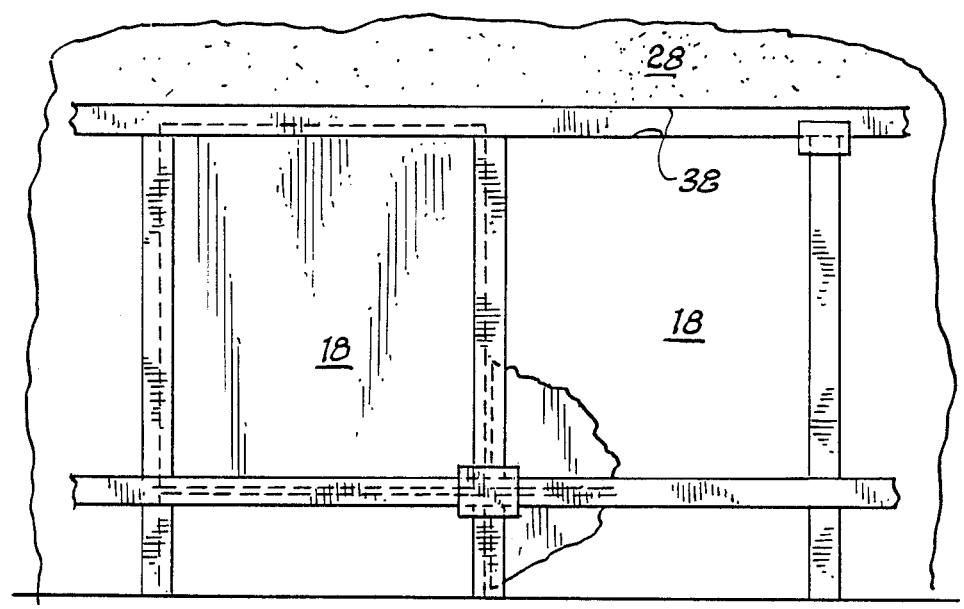
FIG. 7 illustrates diagrammatically a portion of a wall covered with shielding foil and sealed at the seams with any of the above-described methods of application of the tape.

The tape of the instant invention is shown in its most basic form in FIG. 1. In this embodiment, the tape comprises a body or backing 10 which would ordinarily be of copper or another flexible metal or metal alloy. The tape itself would generally fall within the thickness limits of 0.0005 inch to 0.020 inch. The metal backing is corrugated into a series of alternating raised bands 12, and lands 14 between the bands. The lands are flat on their lower (contacting) surface to make as intimate metal-to-metal contact as possible with the underlying foil or panel, and establish as continuous conductivity as is possible.

In the concave portion of each of the raised bands is a strip of adhesive 16. This adhesive is a high performance adhesive, and can either be a dielectric, or may be treated to make it electromagnetically lossy, such as by embedding it with particles of iron.

The adhesive patches 16 are preferably slightly thinner than the degree of raising of the raised bands 17 so than when the tape is compressed onto the underlying foil or metal panel structure, the adhesive holds the underlying lands against the underlying structure with a certain degree of compression.

For example, as indicated in FIG. 1, the adhesive is 0.005 inches thick, and the raised bands are raised 0.006, so that the adhesive is constantly under tension, pulling the tape down against the underlying surface. The width of the channels 13 is from 0.1" to 1" for best practical attenuation, as discussed in more detail below. The attenuation characteristics of the channels are established by the width rather than the depth of the channels, provided the depth is much less than the width.

Figure 10A:
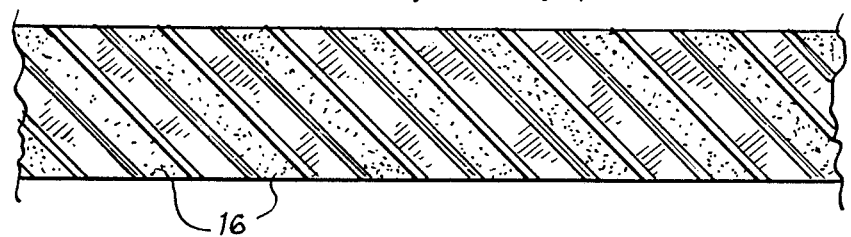
FIG. 10A illustrates the tape utilizing diagonal channels.
Figure 10B:
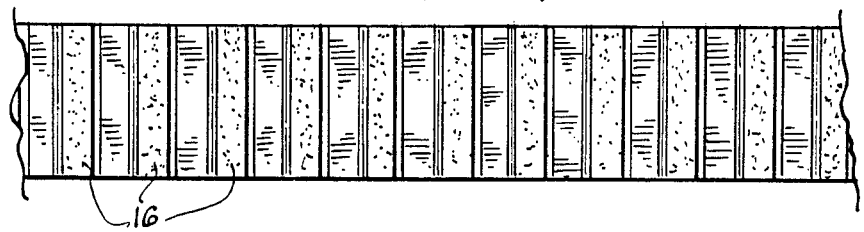
FIG. 10B illustrates the tape similar to FIG. 1 but with perpendicularly-oriented channels.

The channels are transverse of the tape, but not necessarily perpendicular to it. The perpendicular embodiment is shown in FIG. 10(b), and would ordinarily be the embodiment used, but bias or diagonal channels transverse of the run of the tape could also be used, as shown in FIG. 10(a). Diagonal channels would extend the channel length without extending the width of the tape. However, the discussion herein regarding the attenuation formula and other areas is made with the perpendicular version in mind, and some adaptations of the calculations might need to be made when using bias tape.

The tape is to be used with typical shielding panels, which are currently either foil or thin metal sheets. The tape will work equally well with the foil or the sheets, and is described below in application with both shielding formats.

FIG. 3 illustrates the most basic method of sealing the seams. In this embodiment, a pair of butting foil or sheet metal panels 18 are mounted to the underlying surface such as wall board 20. Depending on whether the panels are made of foil, thin sheet metal or thicker sheet metal, panel thicknesses vary from about 0.005" to 0.060". With such a butt joint, a gap 22 is left between the sheets to accommodate expansion. Although electromagnetically speaking it would be desirable to butt the two panels directly up against one another, in practice this will not work well as heat expansion of the panels would cause buckling, which would tend to create gaps which would more than cancel the advantage obtained by butting the panels directly edge-to-edge.

The tape 24 is applied along the seams, centered over the gap 22 as shown in the Figure. This tape is the single-sided tape illustrated in FIGS. 1 and 2. As will become clear from study of the graph of FIG. 8 and the formula from which the graph was prepared, both to be discussed below, the sealing technique of FIG. 3 is the simplest, but also the least effective, of the several methods of implementing the seam seal utilizing one or another of the embodiments of the tape.

Figure 9:
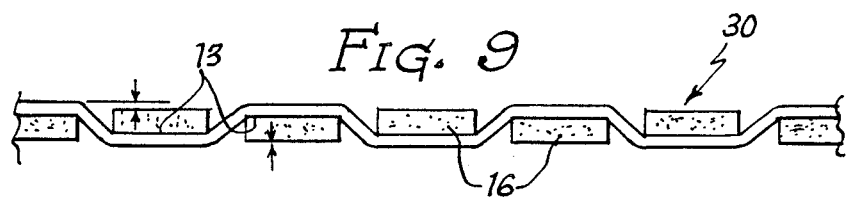
FIG. 9 is a side elevation view of the double-sided tape.

Turning to a second, more effective technique shown in FIG. 4, this mode of use involves overlapping the edges of the shielding panels 26. This technique would ordinarily be used only for foil, or thin sheet metal and not for rigid metal panels. The first foil panel on the left in FIG. 4, is applied to the wall board 20. Then a double-backed embodiment of the tape, indicated at 30 in FIG. 4 and shown in more detail in FIG. 9 is applied halfway onto the first foil panel, and halfway onto the wall board as illustrated. The second foil panel is then applied as shown, lapping to the edge of tape 30.

In addition to being double-adhesive backed, this embodiment of the tape also defines the channels 13 on both sides. As shown in FIG. 9, the tape is basically symmetrical about its central plane, with channels being defined on both sides with adhesive patches 16 applied in each channel. As will be apparent from the graph of FIG. 8, this technique is considerably more effective than the technique illustrated in FIG. 3 for attenuating radiation attempting to cross the inter-panel junction.

FIG. 5 illustrates another technique utilizing the double-backed tape, but which does not achieve the shielding effectiveness of the arrangement of FIG. 4. According to this technique, the tape 30 is applied against the underlying wall surface 20 prior to the application of the foil panel 26 against the forward surface of the tape. Double-sided tape of the kind illustrated in FIG. 9 is used, but only the waveguide channels on the forward face of the tape, which are press against the foil, are effective.

The embodiment of FIG. 5 would not ordinarily stand by itself, but would be completed by the addition of a second strip of single-sided tape 34, illustrated in FIG. 6. This sandwich, utilizing a double-sided tape strip between the wallboard 20 and the foil 24, and a single-sided strip 34 on the room-side of the foil creates the best joint of all. When using 6-inch wide tape with ⅛th-inch wide channels, attenuation of close to 136 dB is achieved up to almost 10 GHz.

Figure 11:
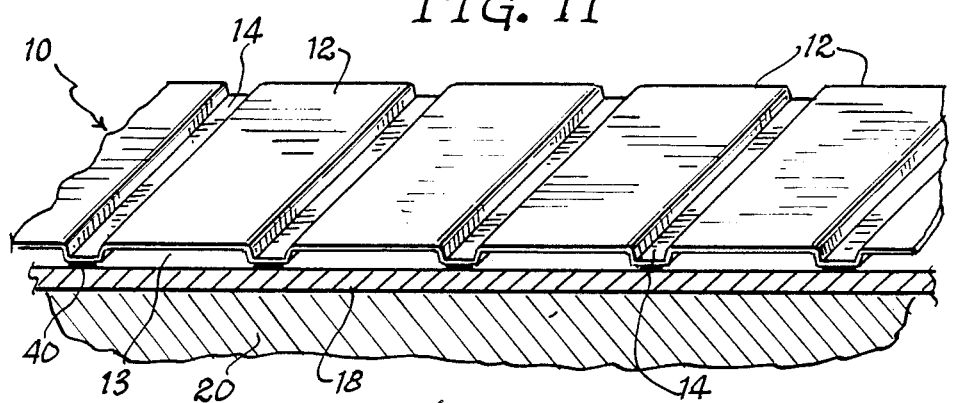
FIG. 11 is an isometric view of a modification of the tape in which the lands are soldered and the adhesive in the channels is omitted; and, FIG. 12 is an edge elevation of a variation of the modification of FIG. 11 in which both sides of the tape define both channels and solder-coated lands for sandwich construction using the solder coated embodiment.

In a slight departure from the other embodiments of the tape, FIG. 11 illustrates an embodiment in which, rather than using patches of adhesive in the channels to bond the tape to the shielding panels, the lands can be coated with solder. The tape can then be applied in the same way as conventional continuous-sheet solder tape, with a hot flat iron. The channels would then be open, without the adhesive filler of the other embodiments.

Solder-bonded tape of this type has a major advantage over continuous-sheet solder tape. When soldering the latter, because the solder is in the form of an entire sheet rather than being in a line or point, the melted solder "squeegees" around under the metal backing, forming pockets of air and high plateaus, and oozing unpredictably in response to hot and cold areas, leaving the voids and pinholes that are the nemesis of electromagnetically tight seam sealing. The capillary-type attraction that makes solder work so well is not very effective over a broad surface area.

The narrow bands of solder 40 on the embodiment in FIG. 11 are sufficiently narrow that capillary action puddles the solder right around the lands 14, making a secure, continuous and substantially void-free solder line. Because the solder band is not part of a continuous surface, each band can be completely melted and then left to cool, rather than having regions which are part liquid and part solid as in a large surface of solder.

Figure 12:
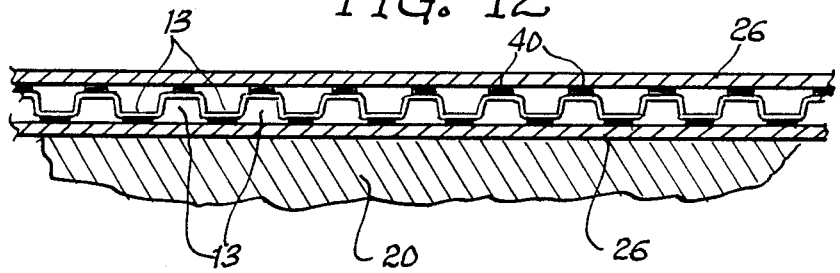

FIG. 11 illustrates soldered-land tape having solder-coated lands on only one side. Clearly, the concept could be broadened to cover both sides, as shown in FIG. 12, and used in the same sandwich construction as the adhesive bonded tape of FIG. 9, although is anticipated that there might be quality control problems that would not occur with the single-sided solder coated version.

FIG. 7 illustrates a typical installation of the shielding and tape on a wall. Although this illustration specifically is addressed toward the sandwich implementation of FIG. 6, it is essentially applicable to all of the installation techniques. In any of the techniques the shielding panels to which the tape is applied must be carefully cleaned prior to taping.

As shown in FIG. 7 first, the shielding panels are laid out against the wall and marked, so it is apparent where the seams will fall. Then, the wall is coated with contact cement 28, carefully leaving uncemented swaths 38 wide enough to apply the tape. Then the tape is put in place along the swaths 38. Now, the panels 18 are coated with contact cement except along those portions which will fall on the shielding tape, and the foil panels are pressed into place. They are firmed up in place with rollers or other pressure-applying means.

Once all of the panels have been installed in this fashion with the double-sided tape along the seams between the foil and the, wall, the second, single-sided tape is applied against the front of the seam to create the sandwich illustrated in FIG. 6.

Naturally, there are a number of single and triple corner and edge configurations requiring somewhat special techniques to seal, some of which were addressed in another patent to the instant inventor, U.S. Pat. No. 4,733,013, for a SHIELD SYSTEM AND SANDWICH SEAM FOR ATTENUATION OF ELECTROMAGNETIC ENERGY. However, beyond acknowledging that clearly some such techniques must be used to make secure corner and edge seals, this disclosure is restricted to the tape and the basic panel-to-panel seal created with the tape.

The tape of the instant invention diverges dramatically from that of the prior art, in that it creates channels 13 which operate as waveguides beneath cutoff to attenuate electromagnetic energy attempting to cross the seam. Prior techniques were totally devoted to creating conducting seals that were as electromagnetically continuous as possible with solder tape or conductive tape, simulating a continuous foil or sheet metal panel, or as described in the above referenced patent, by means of fasteners.

The attenuation of electromagnetic radiation passing through a waveguide beyond cutoff is controlled by the following formula:

$$A = 0.0046 L F_o \left[ \left( \frac{F_c}{F_o} \right)^2 - 1 \right]^{\frac{1}{2}} dB$$

In this formula:
L = gap length traveled by escaping radiation;
Fo = operating frequency in MHz;
Fc = cutoff frequency of the gap in MHz = 5900/g;
g = width of gap in inches.

Figure 8:
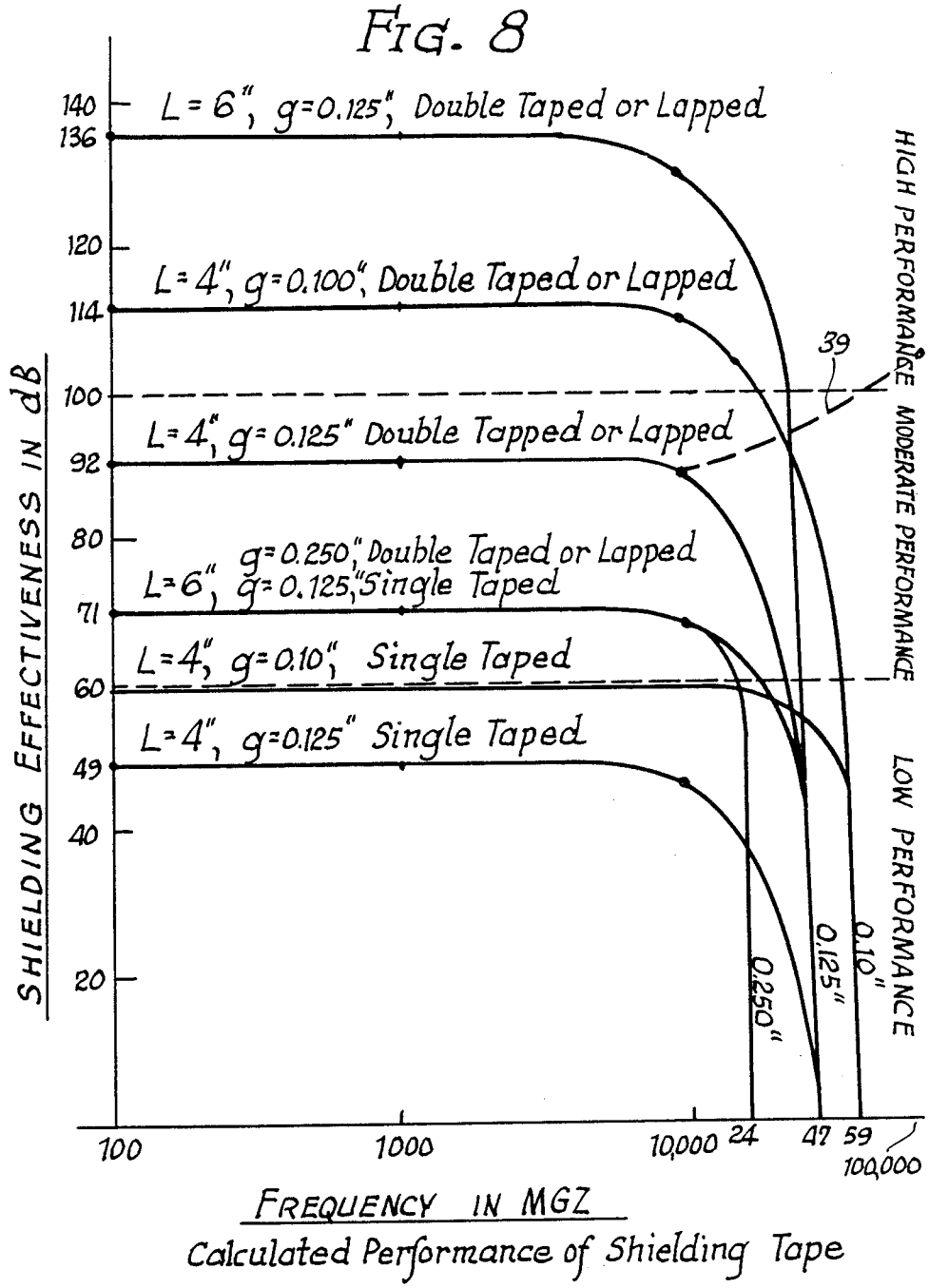
FIG. 8 illustrates the shielding effectiveness of various widths of the tape in various double and single or lapped applications.

Performance of the tape, utilizing this standard formula to calculate the results, is shown in FIG. 8. On the graph however, L = the width of the tape, which does not entirely correspond to the L in the formula inasmuch as the application of the tape shown in FIGS. 3 and 5, where a single strip of tape is used, escaping radiation would only have to travel half the width of the tape.

However, in the sandwich construction of FIG. 6 in the double-sided connection of FIG. 4, radiation travels the entire width of the tape. As clearly expressed by the formula, attenuation is proportional to the length of the gap, and thus the wider the tape, or under the doubling effect achieved by using duel tape or the sandwich construction of FIG. 4, attenuation increases dramatically. The greatest attenuation is achieved by the utilization of six-inch wide tape and either the sandwich or the lapped configuration, in which the waveguide channels are ⅛th inch wide. As can be seen from the graph, performance drops substantially when the width of the tape is reduced to 4 inches, and when the width of the waveguide channels is expanded beyond about ⅛th of an inch.

As can be seen from a study of the formula, attenuation effectiveness is a function of channel length L and channel width g. In the frequency ranges of importance to this application, which are frequencies generally below 10 GHz, the range of g is between 0.10 inch and 1 inch for optimal performance. The width of the tape, according to the formula, is limited only by the practicality of applying very wide tape, as the wider the tape, the greater the effectiveness of the seal. Practical widths are generally considered to be between 1" and 6".

The tape is not inexpensive, so cost considerations, including labor costs, must be weighed against the increased attenuation achievable by increasing the width of the tape, or by using double-taped rather than single-taped joints. As can be seen in the graph of FIG. 8, attenuation in the range below 10 GHZ can be increased from 49 dB to 71 dB by increasing tape width from 4" to 6", with a commensurate increase in tape cost of about 50%.

With tape width (L) maintained at 6", and g=0.125, using double taping rather than single taping increases attenuation from 71 dB to 136 dB, but with a two-fold increase in tape cost, as can be seen from FIG. 8. Although decreasing "g", the widths of the waveguide channels, increases both cutoff frequency and attenuation, there is a practical limit to the minimum width of g, below which the width of the adhesive strips is inadequate to provide proper adhesion to the metal panels. With the solder-coated embodiment, below a certain minimum width g the solder will tend to fill in the channels.

Some enclosures do not need to be shielded beyond, say, 60 dB, such as those using existing tapes with conductive adhesive. In these installations, obviously money could be saved when using the present invention by going with single-sided taping, or double taping with narrow tape. However, the real contribution of the tape of the instant invention lies in the higher attenuation levels, where clearly costs will be higher. Nonetheless, throughout the entire range of attenuation capabilities available with the tape, costs can be minimized by carefully selecting tape type and application technique from the different applications presented in this description.

At frequencies in excess of 2 GHz, the addition of lossy material to the adhesive layer will improve the shielding effectiveness of the tape as illustrated at 39 in FIG. 8. Two such materials are iron powder and conductive carbon powder.

The transverse waveguide channels 13 are provided either perpendicular to the run of the tape as shown in FIG. 10B, or they can be provided at a diagonal angle as shown in FIG. 10A. In the latter case, a longer "L" is achieved and lets a higher attenuation per width of tape. The trade-off is that fewer channels per inch can be provided along the run of the tape. Further experimentation may indicate the optimal design from this perspective, or the optimal design for a particular application.

Another important factor in the design of shielded enclosure joints is galvanic compatibility between the metal of the shielding panels and that of the tape, or at least those surfaces of the tape and panels which are bonded together.

The oxidation of metal involves the transfer of electrons from the metal to the oxidizing agent. In this process of oxidation, an electromotive force (EMF) is established between the metal and the solution containing the oxidizing agent. A metal in contact with an oxidizing solution containing its own metal ions establishes a fixed potential difference with every other metal in the same condition. The set of potentials determined under a standard set of conditions is known as the EMF series.

The importance of the EMF series is that it shows the relative tendencies of metals to corrode. Metals high in the series react more readily and are more prone to corrosion. Two metals in contact with one another will form an electrolytic cell, with the metal higher in the EMF series forming the anode and the lower forming the cathode. The more widely separated the metals on the EMF series chart, the better battery the metals make and the greater the corrosion. A portion of the EMF series used by the American Chemical Society is shown below:

| METAL | ELECTRODE POTENTIAL (in volts) |
|---|---|
| Magnesium | 2.37 |
| Aluminum | 1.66 |
| Zinc | 0.763 |
| Iron | 0.440 |
| Cadium | 0.403 |
| Nickel | 0.250 |
| Tin | 0.136 |
| Lead | 0.126 |
| Copper | −0.337 |
| Silver | −0.799 |
| Palladium | −0.987 |
| Gold | −1.50 |

Clearly corrosion between the metal of the seam tape and the metal of the shielding panels would result in radiation leakage and should be avoided, although the compatibility of the metals used has, unfortunately, not always been given adequate consideration when building shielded enclosures. However, as a general guideline, metals should be within 0.5 volts of one another on the EMF series scale.

Because tin, with a potential of 0.136 volts, is central on the scale, it is a good universal bonding surface. The tin to copper potential is 0.437 v., which is good. Tin to zinc is 0.627 v., and is marginal. Tin to iron is very good at 0.304 v. Zinc and iron are close, which is why galvanized iron works well.

Within these considerations, a good overall material for the e to be made of is tin plated copper. Brass is also good. The shielding metal will often be steel which will work well with these tapes. Copper is also used, which would work well. Specialized or unusual shielding panel metals might require a special tape.

In any of the embodiments, the instant invention represents a substantial departure from prior techniques and sealing panel joints. The technique can be summarized as utilizing waveguide attenuation beyond cutoff in tape-sealed joints as opposed to the attempted creation of a completely solid, aperture and slit-fee sheet of metal.

Use of the tape of this invention is advantageous over the prior art in that it will enable attenuations of greater than 100 dB to be achieved routinely without the use of relatively expensive welded and soldered seams and their potential for pinholes and susceptibility to substandard workmanship. Also, performance may be tailored to the needs of the installation by changing the width of the tape and the number of layers.

I claim:
1. A structure for attenuating the passage of electromagnetic energy comprising:
  (a) at least two panels made of electromagnetic energy-attenuating materials having adjacent edges thereof disposed in substantially abutting relationship to form at least a portion of an enclosure with a seam defined along a line at which said panels substantially abut;
  (b) an electromagnetic-attenuating strip disposed astraddle and lengthwise of said seam and compressed against said panels to substantially seal said seam; and,

(c) said strip defining a plurality of channels extended transversely of said seam to act as waveguides operating beyond cutoff to attenuate electromagnetic energy crossing said seam.

2. Structure according to claim 1 wherein said panels are of metallic composition of thickness between 0.005 inch and 0.060 inch, and said attenuating strip is a flexible tape on the order of 0.010 inch thick.

3. Structure according to claim 2 wherein said tape is characterized by having a backing of channel-defining metallic foil.

4. Structure according to claim 3 wherein said channels are defined by raised bands across said foil.

5. Structure according to claim 4 and including a plurality of adhesive strips applied across the length of each respective one of said bands.

6. Structure according to claim 5 wherein the adhesive of said adhesive strips is substantially dielectric in nature to define low impedance waveguides in the channels defined by said bands.

7. Structure according to claim 6 wherein said adhesive is loaded with a lossy material to more effectively attenuate energy transmitted along said channels at frequencies in excess of the 2 GHz range.

8. Structure according to claim 5 wherein said raised bands are mutually spaced by elongated bands, and said raised bands are raised more than the thickness of said adhesive strips to provide a positive conductive contact between said bands and the panel to which said strip adheres.

9. Structure according to claim 1 and including a second electromagnetic energy-attenuating strip disposed astraddle and lengthwise of said seam and compressed against said panels on the side of said panels remote from the side against which said first mentioned strip is compressed to define a sandwich of said seam between two such strips, said second strip defining a plurality of transverse channels in a manner similar to said first-mentioned electromagnetic attenuating strip.

10. Structure according to claim 9 wherein at least a portion of an enclosure has an outer side mounted against a supporting surface, and the one of said strips on the outer side is a double-sided adhesive strip compressed between said supporting surfaces and said panels.

11. Structure according to claim 1 wherein at least a portion of an enclosure has an outer side, and said outer side is mounted against a supporting surface, and said strip comprised a double-sided adhesive strip disposed between said panels and said supporting surface.

12. A structure for attenuating the passage of electromagnetic energy comprising:
(a) at least two panels made of energy-attenuating materials having overlapping adjacent edges defining a seam of a certain width, to form at least a portion of an enclosure;
(b) an electromagnetic attenuating strip disposed along said seam sandwiched between said panels to substantially seal the overlapping edges of said panels together;
(c) said strip defining a plurality of channels extending transversely relative to said seam to act as waveguide acting beyond cutoff to attenuate electromagnetic energy crossing said seam.

13. Structure according to claim 12 wherein said strip is flexible and is characterized by having a backing of channel-defining metal foil.

14. Structure according to claim 13 wherein said channels are defined by raised metal bands across said foil.

15. Structure according to claim 14 wherein said channels are defined on alternate sides of said metal foil such that said waveguides are defined against the surfaces of both of said panels.

16. Structure according to claim 15 wherein channels on both sides of said foil are covered with adhesive strips such that said electromagnetic-attenuating strip bonds the overlapping edges of said panels together.

17. Structure according to claim 16 wherein said adhesive strips are of such dielectric coefficients that said channels act as waveguides for electromagnetic energy.

18. Structure according to claim 17 wherein said adhesive strips are filled with lossy material to further attenuate energy traveling along said channels.

19. An RF attenuation strip for application against an underlying surface to cover an aperture therein to attenuate electromagnetic energy passing through said aperture, said strip comprising:
(a) a body;
(b) means for holding said body against said underlying surface; and
(c) said body defining a multiplicity of substantially parallel channels to be positionable over said aperture such that a plurality of said channels communicate therewith, and said channels are dimensioned to act as waveguides beyond cutoff for electromagnetic energy below frequencies on the order of 60 GHz.

20. Structure according to claim 19 wherein said strip is comprised of a flexible material to conform to the contours of said underlying surface.

21. An RF attenuation strip for application against an underlying surface to cover an aperture therein to attenuate electromagnetic energy passing through said aperture, said strip comprising:
(a) a body;
(b) means for holding said body against said underlying surface;
(c) said body defining a plurality of substantially parallel channels dimensioned to act as waveguides beyond cutoff for electromagnetic energy below frequencies on the order of 60 GHz;
(d) said strip being comprised of a flexible material to conform to the contours of said underlying surface; and,
(e) said body comprising a flexible metal strip preformed into a series of sequential transverse raised bands defining said channels.

22. Structure according to claim 21 wherein said means for holding said body comprises patches of adhesive applied to the concave side of said raised bands.

23. Structure according to claim 22 wherein said raised bands are separated by bands which conductively contact said underlying surface between said raised bands, and the depth to which said bands are raised exceeds the thickness of said patches of adhesives such that once compressed against said underlying surface, said lands are firmly held thereagainst by said adhesive patches.

24. Structure according to claim 23 wherein said bands are raised on the order of 0.006 inches and said adhesive patches are on the order of 0.005 inches thick.

25. Structure according to claim 23 wherein said lands define adhesive-coated channels on the rear surfaces thereof facing the opposite direction from said first-mentioned channels, such that said strip defines transverse channels on both sides thereof so that it can bond the overlapping edges of two shielding panels together and define transverse waveguide channels against each of said panels.

26. Structure according to claim 22 wherein said adhesive is loaded with lossy material.

27. Structure according to claim 26 wherein said lossy material comprises of powdered iron.

28. Structure according to claim 26 wherein said lossy material comprised powdered conductive carbon.

29. Structure according to claim 19 wherein said channels have a width of from 0.1 inch to 1 inch to optimize attenuation of RF energy.

30. Structure according to claim 29 wherein said strip is of a thickness of between 0.002 inches and 0.020 inches.

31. Structure according to claim 19 wherein said channels are defined with said underlying surface and are substantially rectangular in cross-section to define efficient waveguides to optimize the attenuation of RF energy.

32. Structure according to claim 19 wherein said channels extend substantially orthogonally of the longitudinal run of said strip.

33. An RF attenuation strip for application against an underlying surface to cover an aperture therein to attenuate electromagnetic energy passing through said aperture, said strip comprising:
 (a) a body;
 (b) means for holding said body against said underlying surface; and
 (c) said body defining a plurality of substantially parallel channels dimensioned to act as waveguides beyond cutoff for electromagnetic energy below frequencies on the order of 60 GHz; and,
 (d) said channels being diagonally extended relative to the longitudinal run of said strip to increase the channel length without a commensurate increase in strip width.

34. An RF attenuation strip for application against an underlying surface to cover an aperture therein to attenuate electromagnetic energy passing through said aperture, said strip comprising:
 (a) a flexible metallic backing having transverse raised portions to define transverse channels capable of forming waveguides with an underlying surface;
 (b) said transverse raised portions alternating with transverse lands;
 (c) there being a layer of solder applied to the lower surface of each of said lands such that said strip can be applied against an underlying metallic surface, and heated, and said solder will bond said strip to said underlying surface at the surfaces of said lands.

35. Structure according to claim 34 wherein said lands defining channels thereabove between said raised portions, and the top surfaces of said raised portions are each coated with a layer of solder such that said strip can be sandwiched between two metal surfaces and heated, and said solder will bond to both of said surfaces to define waveguides with each of said surfaces.

36. A structure for attenuating the passage of electromagnetic energy comprising:
 (a) at least two panels made of electromagnetic energy-attenuating materials having adjacent edges thereof disposed in substantially abutting relationship to form at least a portion of an enclosure with a seam defined along a line at which said panels substantially abut;
 (b) an electromagnetic-attenuating strip disposed astraddle and lengthwise of said seam and compressed against said panels to substantially seal said seam;
 (c) said strip defining a plurality of channels extended transversely of said seam to act as waveguides operating beyond cutoff to attenuate electromagnetic energy crossing said seam; and,
 (d) said panels are metal and said strip is a metal having a potential of less than 0.60 volts different from the potential of the metal of said panels on the EMF scale.

37. Structure according to claim 36 wherein said panels are made of iron and said strip is made of tin coated copper.

* * * * *